(12) United States Patent
Frey et al.

(10) Patent No.: US 10,076,026 B2
(45) Date of Patent: Sep. 11, 2018

(54) ELECTRICALLY CONDUCTIVE ARTICLES

(71) Applicant: 3M INNOVATIVE PROPERTIES COMPANY, St. Paul, MN (US)

(72) Inventors: Matthew H. Frey, Cottage Grove, MN (US); Brock A. Hable, Woodbury, MN (US); Thomas Herdtle, Inver Grove Heights, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 353 days.

(21) Appl. No.: 14/437,511

(22) PCT Filed: Nov. 19, 2013

(86) PCT No.: PCT/US2013/070712
§ 371 (c)(1),
(2) Date: Apr. 22, 2015

(87) PCT Pub. No.: WO2014/088798
PCT Pub. Date: Jun. 12, 2014

(65) Prior Publication Data
US 2015/0289366 A1    Oct. 8, 2015

Related U.S. Application Data

(60) Provisional application No. 61/734,706, filed on Dec. 7, 2012.

(51) Int. Cl.
*H05K 1/02* (2006.01)
*G06F 3/041* (2006.01)
(Continued)

(52) U.S. Cl.
CPC .......... *H05K 1/0296* (2013.01); *G06F 3/041* (2013.01); *G06F 3/044* (2013.01);
(Continued)

(58) Field of Classification Search
CPC ............................ H05K 3/10; H05K 3/3452
(Continued)

(56) References Cited

U.S. PATENT DOCUMENTS 8,179,381 B2    5/2012  Frey
2007/0181878 A1  8/2007  Song
(Continued)

FOREIGN PATENT DOCUMENTS

JP    2009-237523    10/2009
JP    2010-86665     4/2010
(Continued)

OTHER PUBLICATIONS

International Search report for PCT International application No. PCT/US2013/070712 dated Mar. 10, 2014, 4 pages.
(Continued)

*Primary Examiner* — Timothy Thompson
*Assistant Examiner* — Stanley Tso
(74) *Attorney, Agent, or Firm* — Adrian L. Pishko; Gregory D. Allen

(57) ABSTRACT

Articles comprising a substrate having a first major surface; an electrical conductor pattern on the first major surface of the substrate, the electrical conductor pattern comprising a plurality of separated pairs of separated first and second electrically conductive metallic traces. Optionally the articles further comprise a first electrically conductive layer. Embodiments of articles described herein are useful in, for example, displays, touch sensors, lighting elements, photovoltaic cells, electrochromic windows and displays, and electroluminescent lamps and displays.

14 Claims, 9 Drawing Sheets

(51) Int. Cl.
*H01L 31/0224* (2006.01)
*G06F 3/044* (2006.01)

(52) U.S. Cl.
CPC ........... *H01L 31/022433* (2013.01); *G06F 2203/04112* (2013.01); *Y02E 10/50* (2013.01)

(58) Field of Classification Search
USPC .......................................... 174/250
See application file for complete search history.

(56) References Cited

U.S. PATENT DOCUMENTS

| | | |
|---|---|---|
| 2008/0259262 A1 | 10/2008 | Jones et al. |
| 2008/0314626 A1 | 12/2008 | Moore |
| 2009/0189532 A1 | 7/2009 | Preuss |
| 2010/0026664 A1 | 2/2010 | Geaghan |
| 2010/0101832 A1 | 4/2010 | Verhaverbeke et al. |
| 2010/0196655 A1 | 8/2010 | Kai et al. |
| 2010/0328248 A1 | 12/2010 | Mozdzyn |
| 2011/0050631 A1 | 3/2011 | Kwon |
| 2011/0095900 A1 | 4/2011 | Smith |
| 2011/0095990 A1* | 4/2011 | Philipp ................ G06F 3/044 345/173 |
| 2011/0260741 A1* | 10/2011 | Weaver ................ G06F 3/0418 324/686 |
| 2012/0013545 A1 | 1/2012 | Philipp |
| 2012/0031746 A1 | 2/2012 | Hwang et al. |
| 2012/0187821 A1* | 7/2012 | Lee ................ H01L 51/5212 313/498 |
| 2012/0231248 A1 | 9/2012 | Sato et al. |
| 2013/0050228 A1* | 2/2013 | Petersen ............ H01L 23/053 345/501 |
| 2013/0207924 A1* | 8/2013 | Mohindra ............. G06F 3/044 345/174 |

FOREIGN PATENT DOCUMENTS

| | | |
|---|---|---|
| JP | 2011-517367 | 6/2011 |
| JP | 2012-79238 | 4/2012 |
| JP | 2012-209030 | 10/2012 |
| JP | 2012-216449 | 11/2012 |
| KR | 2009-0098947 | 9/2009 |
| KR | 2012-0130938 | 12/2012 |
| WO | WO 2009/108771 | 9/2009 |
| WO | WO 2011/058898 | 5/2011 |
| WO | WO 2012-106417 | 8/2012 |

OTHER PUBLICATIONS

Supplementary European Search Report, EP Application No. 13860946, 4 pages.

* cited by examiner

ELECTRICALLY CONDUCTIVE ARTICLES

CROSS REFERENCE TO RELATED APPLICATIONS

This application is a national stage filing under 35 U.S.C. 371 of PCT/US2013/070712, filed Nov. 19, 2013, which claims priority to Provisional Application No. 61/734,706, filed Dec. 7, 2012, the disclosures of which are incorporated by reference in its/their entirety herein.

BACKGROUND

Materials and components that are electrically conductive and transparent are used as electrodes in, for example, liquid crystal displays, photovoltaic cells, touch display sensors, photodetectors, electrochromic windows, inorganic electroluminescent lamps, organic light emitting diodes (OLED) lamps, and displays. The efficiency or performance of these devices is dependent, for example, upon the electrical transport characteristics (described quantitatively by electrical sheet resistance, Rs, measured in units of ohms per square) and the optical characteristics (described quantitatively primarily by the light transmittance, % T, measured in units of percentage). For most devices, efficiency or performance is enhanced when transparent electrode electrical sheet resistance is reduced or light transmittance increased. Low electrical sheet resistance and high light transmittance are conflicting properties in materials, which forces trade-offs in the device design, performance, and efficiency. Individual materials such as indium tin oxide or electrically conducting polymers such as PEDOT-PSS offer their inherent, limited levels and trade-offs between electrical sheet resistance and light transmittance. Thus, there is a need in the art to improve upon existing transparent electrically conductive materials and components, to reduce electrical sheet resistance or increase light transmittance vs. standard materials.

SUMMARY

In one aspect, the present disclosure describes an article comprising:
a substrate having a first major surface;
an electrical conductor pattern on the first major surface of the substrate, the electrical conductor pattern comprising:
a plurality of separated pairs of separated first and second electrically conductive metallic traces (see, e.g., FIGS. 1-5), the first and second electrically conductive metallic traces of each pair having a length of overlap relative to each other of at least 5 (in some embodiments at least 10, 25, 50, or 100; or in a range from 5 to 1,000, 10 to 500, 15 to 250, or even 50 to 200) times their separation distance, and wherein there are at least 50 (in some embodiments, at least 75, 100, 150, 200, 250, 500, 1,000, 5,000, 10,000, 25,000, 50,000, 75,000, 100,000, or even at least 150,000; in some embodiments, in a range from 100 to 150,000, 500 to 150,000, 1,000 to 150,000, 5,000 to 150,000, 10,000 to 150,000, or even 25,000 to 150,000) of the electrically conductive metallic traces/cm$^2$.

Optionally, articles described herein further comprise a first electrically conductive layer having first and second generally opposed major surfaces, wherein a major surface of the first electrically conductive layer is in contact with at least a portion (in some embodiments at least 1, 2, 3, 4, 5, 10, 15, 20, 25, 30, 35, 40, 45, 50, 55, 60, 65, 70, 75, 80, 85, 90, 95, 99, or even 100 percent of the plurality of pairs of first and second electrically conductive metallic traces generally parallel with the first major surface of the substrate) of the plurality of pairs of first and second electrically conductive metallic traces. Optionally, the electrically conductive layer is patterned and comprises first and second, separated regions (in some embodiments, additional (e.g., a third) separated regions), and optionally further comprises a first address trace electrically connected to the first region, and a second address trace electrically connect to the second region (and, in some embodiments optionally an additional address trace(s) electrically connected to an additional region(s) if present).

In another aspect, the present disclosure describes a method of making an article described herein comprising:
providing a substrate having a first major surface; and
depositing a plurality of separated pairs of separated first and second electrically conductive metallic traces onto the first major surface of the substrate to provide the article.

In another aspect, the present disclosure describes a method of making an article described herein:
providing a substrate having a first major surface;
providing a metal layer onto the first major surface of the substrate; and
etching a metal layer to provide a plurality of separated pairs of separated first and second electrically conductive metallic traces on the first major surface of the substrate to provide the article.

In another aspect, the present disclosure describes a method of making an article described herein, the method comprising:
providing a substrate having a first major surface;
depositing an electrically conductive layer onto the first major surface;
depositing a plurality of separated pairs of separated first and second electrically conductive metallic traces onto the electrically conductive layer to provide the article.

In another aspect, the present disclosure describes a method of making an article described herein, the method comprising:
providing a substrate having a first major surface;
depositing an electrically conductive layer onto the first major surface;
depositing a metal layer onto the electrically conductive layer to provide the article; and
etching the metal layer to provide a plurality of separated pairs of separated first and second electrically conductive metallic traces on the first major surface of the substrate to provide the article.

Embodiments of articles described herein are useful, for example, displays, touch sensors, lighting elements (e.g., light emitting diodes (e.g., organic light emitting diodes)), photovoltaic cells, electrochromic windows and displays, and electroluminescent lamps and displays.

Advantages offered by embodiments of articles described herein and their manufacture include not needing a single patterning process that can simultaneously achieve a large range in feature size (i.e., microscopic (e.g., submicrometer) mesh traces and macroscopic (e.g., millimeter) bonding pads from the same process), expensive, high resolution custom tooling for every device design iteration with a transparent conductor that could benefit from microscopic mesh traces, and registration of any subsequent patterning process to a metal micropattern.

DETAILED DESCRIPTION

Exemplary substrates include glass and polymer films (e.g., polymer films selected from the group consisting of poly(ethyleneterephthalate) (PET), cyclic olefin polymer (COP), poly(ethylenenaphthalate) (PEN), polycarbonate (PC), cellulose triacetate (TAC), and cyclic polyolefin copolymer). In some embodiments, the substrate is transparent (i.e., transmits visible light in a percentage of at least 50% (in some embodiments at least 75%, 80%, 85%, 90%, or even at least 95%)). In some embodiments, where transparency is not required, the substrate is opaque (i.e., transmits visible light in a percentage of less than 5% (in some embodiments less than 4%, 3%, 2%, 1%, 0.5%, or even less than 0.1%)).

Typically, the electrical conductor pattern has an open area fraction greater than 80, 90, 95, 96, 97, 98, 99, or even at least 99.5; in some embodiments, in a range from 80 to 99.75, 90 to 99.75, 90 to 99.5, 95 to 99.75, or even 95 to 99.5, although values outside of these typical values are also useful.

Figure 1:
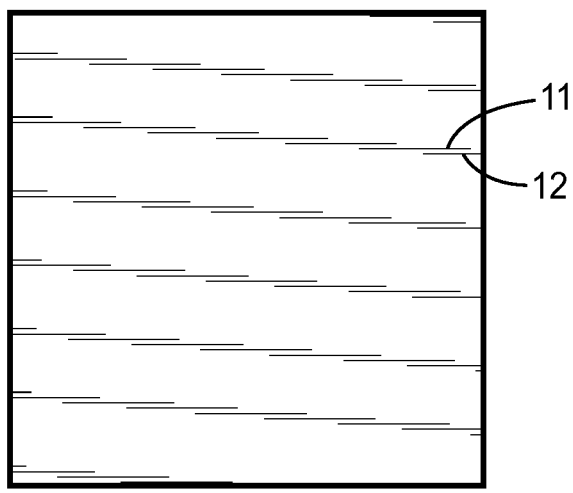
FIGS. 1-4 are illustrations of exemplary electrically conductive metallic traces for articles described herein.

Exemplary electrical conductor patterns are illustrated in FIGS. 1-4. Referring to FIG. 1, electrical conductor pattern 10 has plurality of separated pairs of separated first (11) and second (12) non-branched electrically conductive metallic traces, first (11) and second (12) electrically conductive metallic traces of each pair having a length of overlap relative to each other, of at least 5 times their separation distance. The term electrically conductive describes a material, in the form of, for example, a trace or a layer, that exhibits an effective bulk electrical conductivity of at least 10 siemens per centimeter. For example, electrically conductive polymers are known which exhibit bulk electrical conductivity of, for example, at least 1,000 siemens per centimeter. Compositions of indium tin oxide can exhibit bulk electrical conductivity of, for example, 10,000 siemens per centimeter. Pure silver exhibits a bulk electrical conductivity of $6.3 \times 10^5$ siemens per centimeter. The term effective, in effective bulk conductivity, is intended to allow for the possibility of composite materials within the scope of electrically conductive materials of the present disclosure, the composite materials having multiple phases with different local bulk electrical conductivity. The term overlap refers to portions of two adjacent separated electrically conductive metallic traces that make up a pair, as described herein, or that are each a member of separated but adjacent pairs, the electrically conductive traces being separated (physically and electrically) from each other in the plane of the substrate, the portions being approximately parallel with each other or maintaining an approximately constant separation from each other over the overlap distance (length). "Separated", means the traces are not in physical or in electrical contact with each other, except when, for example, electrically connected through the electrically conductive layer. The term overlap does not refer to physical or electrical contact, nor to coincident position in the plane of the substrate. Electrically conductive metallic traces have lengths, widths, and thickness. Electrical conductor pattern 10 has open area fraction (i.e., the surface area of the surface on which the electrically conductive metallic traces are on that are not covered by the electrically conductive metallic traces).

Figure 2:
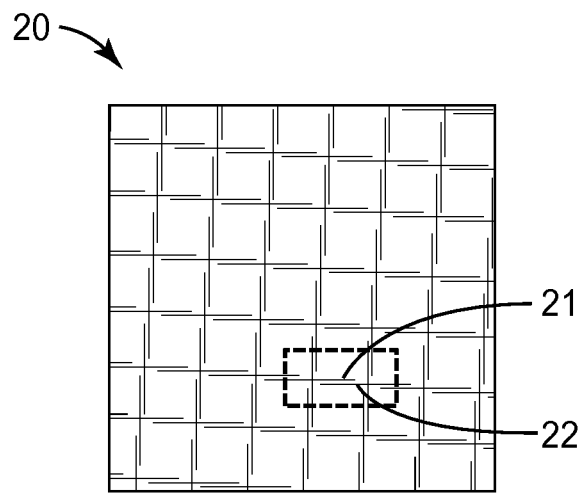
Figure 2A:
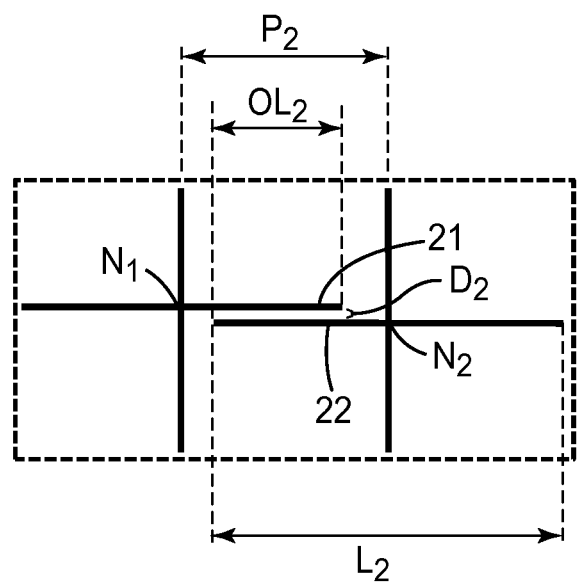
FIGS. 2A, 5A, and 5B are illustrations of exemplary pairs of electrically conductive metallic traces for articles described herein.

Referring to FIGS. 2 and 2A, electrical conductor pattern 20 has plurality of separated pairs of separated first (21) and second (22) branched electrically conductive metallic traces, first (21) and second (22) electrically conductive metallic traces of each pair having a length of overlap relative to each other, $OL_2$, of at least 5 times their separation distance, $D_2$. Electrically conductive metallic traces have lengths, $L_2$, widths, and thickness. Electrical conductor pattern 20 has open area fraction, and pitch, $P_2$.

Figure 3:
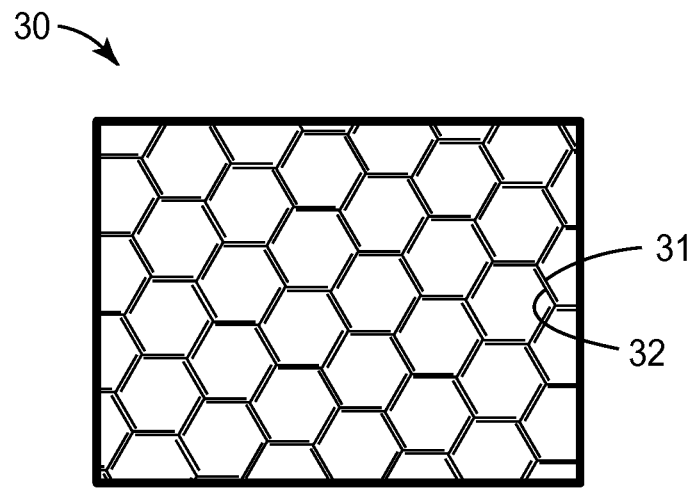

Referring to FIG. 3, electrical conductor pattern 30 has plurality of separated pairs of separated first (31) and second (32) branched electrically conductive metallic traces, first (31) and second (32) electrically conductive metallic traces of each pair having a length of overlap relative to each other, of at least 5 times their separation distance. Electrically conductive metallic traces have lengths, widths, and thickness. Electrical conductor pattern 30 has open area fraction.

Figure 4:
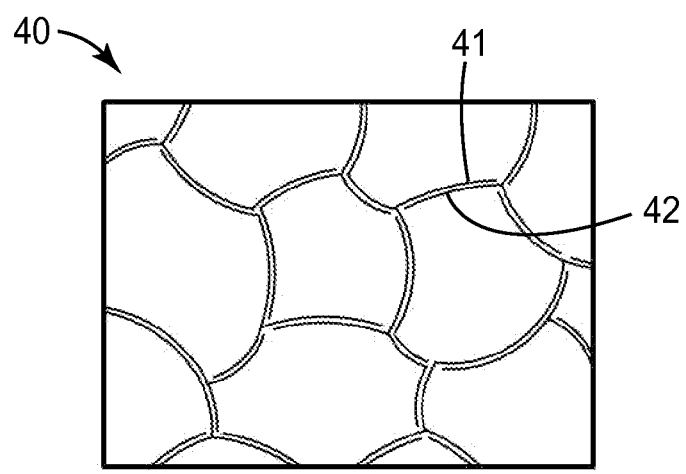

Referring to FIG. 4, electrical conductor pattern 40 has plurality of separated pairs of separated first (41) and second (42) branched electrically conductive metallic traces, first (41) and second (42) electrically conductive metallic traces of each pair having a length of overlap relative to each other, of at least 5 times their separation distance. Electrically conductive metallic traces have lengths, widths, and thickness. Electrical conductor pattern 40 has open area fraction.

Figure 5A:
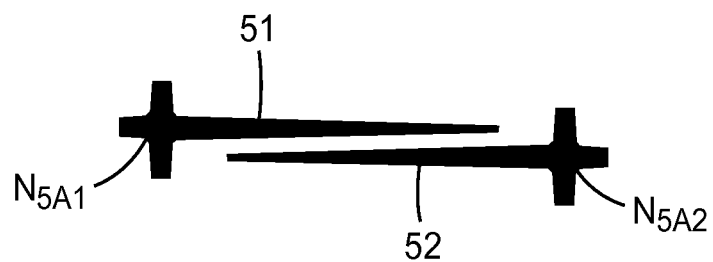

In some embodiments, the first and second electrically conductive metallic traces are linear (see, e.g., FIGS. 1-3), non-linear (see, e.g., FIG. 4), or include both. In some embodiments, the first and second electrically conductive metallic traces are branched (i.e., 21, 22, 31, 32, 41, 42; see, e.g., FIGS. 2-4), non-branched (i.e., 11, 12; see, e.g., FIG. 1), or include both. A branched electrically conductive trace is an electrically conductive trace that includes at least one vertices (also referred to herein as nodes), where at least two linear or non-linear (e.g., arc-shaped) elongated electrically conductive conductor elements converge (connect). At a vertex, an angle can be defined between the elements. Some branched electrically conductive traces have three elements converging at a vertex. Some branched electrically conductive traces have four elements that converge at a vertex. Some branched electrically conductive traces have more than four elements that converge at a vertex. The length of a branched trace is the length of the longest path that can be defined from the end of one elongated electrically conductive conductor element of the trace, through at least one vertex, and to the end of another elongated electrically conductive conductor elements of the trace, as exemplified, for example, by $L_2$ in FIG. 2A. In some embodiments, the plurality of pairs of first and second electrically conductive metallic traces generally form a repeating pattern (i.e., a general formation of parallel lines, a general formation of a square grid or skewed square grid, a general formation of a hexagonal network; see, e.g., FIGS. 1-3). In some embodiments, the plurality of pairs of first and second electrically conductive metallic traces generally form a repeating series of lines (i.e., a general formation of parallel lines; see, e.g., FIG. 1). In some embodiments, the plurality of pairs of first and second electrically conductive metallic traces generally forms a two-dimensional network. The phrase, generally forming (or forms) a two-dimensional network, refers to an arrangement of the electrically conductive metallic traces wherein a continuous network of paths (in the form of a mesh with open cell structure) would result by electrically connecting the electrically conductive metallic traces of the pairs of traces and electrically connecting the adjacent electrically conductive metallic traces of adjacent pair, the adjacent electrically conductive metallic traces of adjacent pairs having the overlap and separation relationships described herein. In some embodiments, the plurality of pairs of first and second electrically conductive metallic traces generally forms a grid (i.e., a general formation of a square grid or skewed square grid; see, e.g., FIG. 2). In some embodiments, the plurality of pairs of first and second electrically conductive metallic traces generally forms a repeating pattern of hexagons (see, e.g., FIG. 3). These embodiments that include pluralities of pairs of first and second electrically conductive metallic traces generally in the form of a square grid, a skewed square grid, or a repeating pattern of hexagons are examples of pluralities of pairs generally in the form of two-dimensional networks. In some embodiments, the metallic first and second electrically conductive metallic traces are generally in the form of a pseudo-random two-dimensional network (i.e., a general formation of a pseudorandom two-dimensional network; see, e.g., FIG. 4). Pseudorandom refers to an arrangement of electrically conductive traces that lacks translational symmetry, but that can be derived from a deterministic fabrication process (e.g., photolithography or printing), for example including a computational design process that includes generation of the pattern geometry with a randomization algorithm. In some embodiments, at least a portion of the pairs of first and second metallic conductive metallic traces are complementarily tapered relative to each other (see, e.g., FIG. 5A), preferably for branched traces and preferably with the traces being tapered down toward narrower width with increasing distance from the vertex (or node) of the branched trace. Referring to FIG. 5A, exemplary pairs of first and second electrically conductive metallic traces 51, 52 are each complementarily tapered relative to each other, and have nodes $N_{5A1}$, $N_{5A2}$.

Figure 5B:
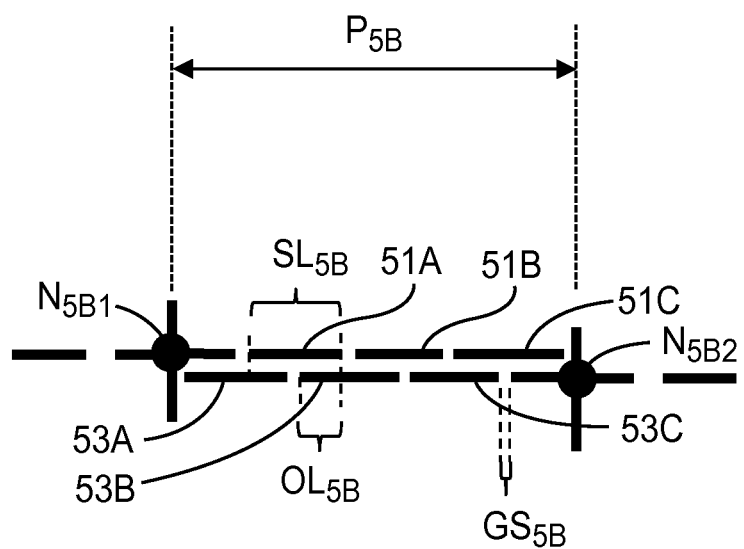

Referring to FIG. 5B, exemplary pairs of first and second electrically conductive metallic traces in segments 51A, 51B, 51C, 53A, 53B, 53C, respectively, with, nodes $N_{5B1}$, $N_{5B2}$, pitch $P_{5B}$, gap between segments (with segment lengths, $SL_{5B}$), $GS_{5B}$, and overlap length, $OL_{5B}$.

Typically, there are at least 1,000 (in some embodiments, at least 10,000, 100,000, 1,000,000, or even at least 10,000,000) pairs of the electrically conductive metallic traces, although values outside of these typical values are also useful.

Typically, adjacent electrically conductive metallic traces of adjacent pairs within the plurality have a length of overlap relative to each other of at least 5 (in some embodiments, in a range from 5 to 1,000, 10 to 500, 15 to 250, or even 50 to 200) times their separation distance.

Preferably, there are at least 50 (in some embodiments, at least 75, 100, 150, 200, 250, 500, 1,000, 5,000, 10,000, 25,000, 50,000, 75,000, 100,000, or even at least 150,000; in some embodiments, in a range from 100 to 150,000, 500 to 150,000, 1,000 to 150,000, 5,000 to 150,000, 10,000 to 150,000, or even 25,000 to 150,000) of the electrically conductive metallic traces/cm$^2$. In some embodiments, there are less than 50 of the electrically conductive metallic traces/cm$^2$, for example in a range from 2 to 50, 5 to 50, 5 to 40, or 10 to 30 of the electrically conductive metallic traces/cm$^2$.

Typically, all of the conductive metallic traces of the pairs have a length of overlap relative to an electrically conductive trace of an adjacent pair of at least 5 (in some embodiments, in a range from 5 to 1,000, 10 to 500, 15 to 250, or even 50 to 200) times their separation distance.

Typically, the electrically conductive metallic traces have an electrical sheet resistance (i.e., the bulk electrical resistivity divided by the electrically conductive metallic trace thickness (z-axis dimension, normal to the plane of the substrate)) of not greater than 5 ohm/square (in some embodiments, not greater than 2, 1, 0.5, 0.4, 0.3, 0.2, 0.1, 0.05, 0.025, 0.01, 0.05, or even not greater than 0.01 ohm/square (in some embodiments, in a range from 0.01 ohm/square to 5 ohm/square, 0.05 ohm/square to 2.5 ohm/square, 0.1 ohm/square to 1 ohm/square, or even 0.2 ohm/square to 0.5 ohm/square), although values outside of these typical values are also useful.

In some embodiments, the electrically conductive metallic traces are darkened (i.e., the visible light reflectance of the electrically conductive traces is less than would characterize a smooth interface between a metal and an insulator, for example air). Darkening of the electrically conductive metallic traces can be achieved by, for example, controlled reaction of their surface (e.g., sulfiding reaction for silver traces, plasma oxidation reaction for silver or copper traces). Darkening of the electrically conductive metallic traces can also be achieved by, for example, fabricating or depositing the electrically conductive metallic traces on an appropriately nanostructured substrate surface, as described, for example, in PCT Publ. No. WO2012/106417, published Aug. 9, 2012, the disclosure of which is incorporated herein by reference. In some applications of transparent conductors, for example, for touch screen sensors, it is desirable for the transparent conductor to reflect the minimum proportion of incident light. In the case of a touch screen sensor, low reflectance for the transparent electrical conductor, for example, electrically conductive metallic traces that make up at least a portion of the transparent electrical conductor, minimizes visual interference between the underlying information display and the touch sensor, especially in strong ambient lighting situations, for example, in sunlight. Electrically conductive metallic traces that are not darkened may have visible light reflectance of greater than 80%. Darkened electrically conductive metallic traces have visible light reflectance of less than 50% (in some embodiments, less than 40%, 30%, 25%, 20%, 15%, 10%, 5%, 4%, 3%, 2%, or even less than 1%).

Exemplary electrically conductive metallic traces comprise at least one of silver, gold, palladium, aluminum, nickel, molybdenum, tungsten, chromium, copper, tin, or nickel.

Typically, the electrically conductive metallic traces have widths not greater than 25 micrometers (in some embodiments, not greater than 15, 10, 5, 4, 3, 2, or even not greater than 1 micrometer); in some embodiments, in a range from 0.1 micrometer to 25 micrometers, 0.25 micrometer to 10 micrometers, 0.5 micrometer to 5 micrometers, or even 0.75 micrometer to 25 micrometers), although values outside of these typical values are also useful.

Typically, the electrically conductive metallic traces have lengths of at least 5 micrometers (in some embodiments, at least 10, 25, 50, 75, 100, 250, 500, 1,000, 5,000, 10,000, 25,000, or even at least 50,000 micrometers; in some embodiments in a range from 100 micrometers to 500 micrometers; in some embodiments, in a range from 10 micrometers to 10 mm, 25 micrometer to 1 micrometer, or even 50 micrometer to 500 micrometers), although values outside of these typical values are also useful.

Typically, the first and second electrically conductive metallic traces have a thickness in a range from 10 nanometers to 20 micrometers (in some embodiments, in a range from 20 nanometers to 5 micrometers, 30 nanometers to 1 micrometer, 40 nanometers to 500 nanometers, or even 50 nanometers to 400 nanometers), although values outside of these typical values are also useful.

Typically, there are at least 1,000 (in some embodiments, at least 5,000, 10,000, 25,000, 50,000, 75,000, 100,000, 500,000, 1,000,000, 5,000,000, or even at least 10,000,000) pairs of the electrically conductive metallic traces, although values outside of these typical values are also useful.

Typically, the length of overlap of the electrically conductive metallic traces of a pair is at least 5 micrometers (in some embodiments, at least 10, 25, 50, 100, 250, 500, 1,000, 10,000, 25,000, or even at least 50,000 micrometers; in some embodiments, in a range from 5 micrometers to 9 mm, 10 micrometers to 1 mm, 25 micrometers to 500 micrometers, 250 micrometers to 500 micrometers, or even 30 micrometers to 300 micrometers), although values outside of these typical values are also useful.

Typically, adjacent electrically conductive metallic traces of adjacent pairs have a length of overlap of at least 5 micrometers (in some embodiments, at least 10, 25, 50, 100, 250, 500, 1,000, 10,000, 25,000, or even at least 50,000 micrometers; in some embodiments, in a range from 5 micrometers to 9 mm, 10 micrometers to 1 mm, 25 micrometers to 500 micrometers, 250 micrometers to 500 micrometers, or even 30 micrometers to 300 micrometers), although values outside of these typical values are also useful.

Typically, each electrically conductive metallic trace of a pair is separated from each other by up to 100 micrometers (in some embodiments, up to 75, 50, 25, 15, 10, 5, 4, 3, 2, 1, 0.75, 0.5, or even up to 0.25 micrometer; in some embodiments, in a range from greater than zero to 100 micrometers, 0.5 micrometer to 50 micrometers, 0.5 micrometer to 25 micrometers, 0.5 micrometer to 15 micrometer, 0.5 micrometer to 10 micrometers, 0.5 micrometer to 5 micrometers, 0.75 micrometer to 3 micrometers, or even 1 micrometer to 2 micrometers), although values outside of these typical values are also useful.

Typically, adjacent electrically conductive metallic traces of adjacent pairs are separated from each other by up to 100 micrometers (in some embodiments, up to 75, 50, 25, 15, 10, 5, 4, 3, 2, 1, 0.75, 0.5, or even up to 0.25 micrometer; in some embodiments, in a range from greater than zero to 100 micrometers, 0.5 micrometer to 50 micrometers, 0.5 micrometer to 25 micrometers, 0.5 micrometer to 15 micrometers, 0.5 micrometer to 10 micrometers, 0.5 micrometer to 5 micrometers, 0.75 micrometer to 3 micrometers, or even 1 micrometer to 2 micrometers)

Figure 6:
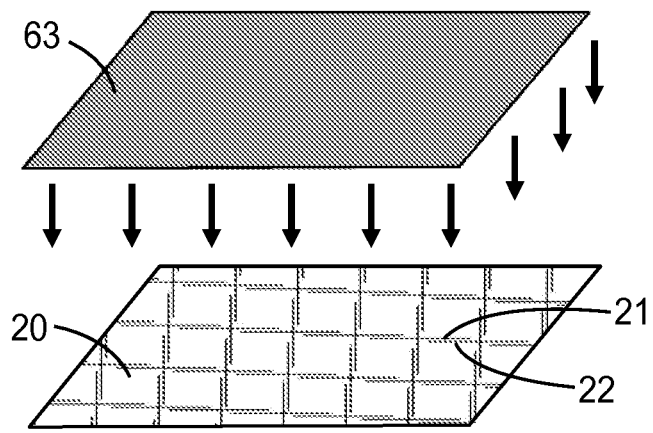
FIGS. 6-11 are exemplary for articles described herein.
Figure 6A:
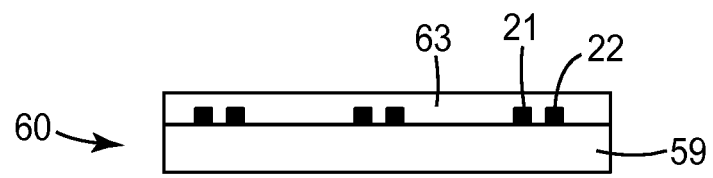

Referring to FIG. 6, exemplary article described herein 20 is shown with electrically conductive layer 63 being added to contact plurality of pairs of first (21) and second (22) electrically conductive metallic traces. FIG. 6A shows a cross-section of the article 60 resulting from FIG. 6, with substrate 59, plurality of pairs of first (21) and second (22) electrically conductive metallic traces, and electrically conductive layer 63.

Figure 7:
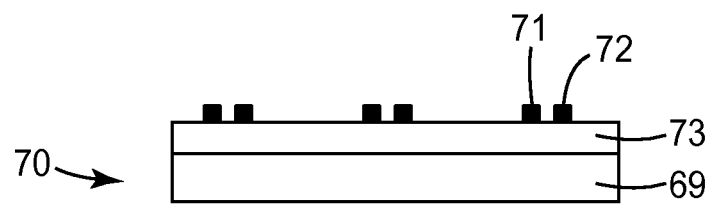

FIG. 7 shows a cross-section of an alternative article 70 with a different construction in terms of the arrangement of substrate 69, plurality of pairs of first (71) and second (72) electrically conductive metallic traces, and electrically conductive layer 73.

Figure 8:
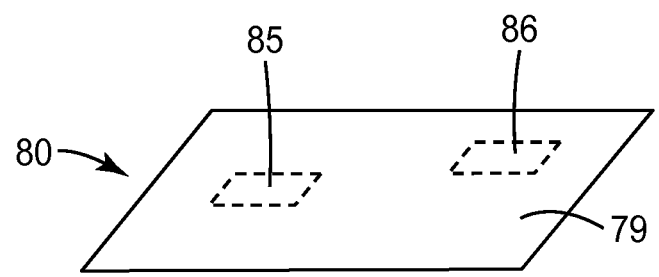

FIG. 8 shows exemplary article 80 having substrate 79 with region 85 comprising a pattern of plurality of pairs of first (21) and second (22) electrically conductive metallic traces (e.g., a pattern as shown in any of FIGS. 1-4) (not shown in FIG. 8) with an electrically conductive layer (not shown in FIG. 8), for example a transparent conductive material layer on the electrically conductive metallic traces and region 86 comprising electrically conductive metallic traces and not comprising an electrically conductive layer. FIG. 8 is a generalized article that would follow from an optimized first process step for patterning a plurality of separated pairs of separated first and second electrically conductive metallic traces, followed by an optimized second process step for patterning an electrically conductive layer, for example printing a transparent conductive material layer, as would be a convenient series of steps for manufacturing a high performance touch screen sensor.

Figure 9:
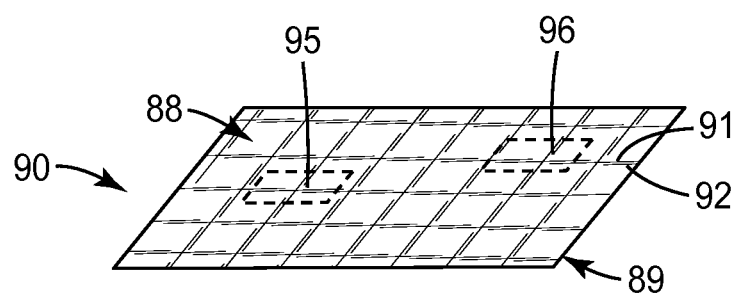

FIG. 9 shows exemplary article 90 having substrate 89 with pattern 88 of plurality of pairs of first (91) and second (92) electrically conductive metallic traces with separated electrically conductive layer regions 95, 96 on the electrically conductive metallic traces (21, 22).

In some embodiments, electrically conductive layer is transparent (i.e., transmits visible light in a percentage of at least 50% (in some embodiments, at least 75%, 80%, 85%, 90%, or even at least 95%)). In some embodiments, where transparency is not required, electrically conductive layer is opaque (i.e., transmits visible light in a percentage of less than 5% (in some embodiments, less than 4%, 3%, 2%, 1%, 0.5%, or even less than 0.1%)).

Embodiments where the electrically conductive layer is transparent are useful as an electrode component in, for example, liquid crystal displays, photovoltaic cells, touch display sensors, photodetectors, electrochromic windows, inorganic electroluminescent lamps, organic light emitting diodes (OLED) lamps and displays. Besides applications where an improved transparent electrode is needed (i.e., where opacity is acceptable), the articles and methods disclosed herein can be advantageous, for example, in the fabrication of printed circuit boards (PCB), printed wiring boards (PWB), flexible printed circuits (FPC). In embodiments where transparency is not required, the electrically conductive layer comprises at least one of copper, silver, aluminum, gold, nickel, tungsten, or molybdenum.

Exemplary electrically conductive layers comprise at least one of metal oxide (e.g., indium tin oxide), electrically conducting polymer (e.g., poly(3,4-ethylenedioxythiophene)-poly(styrenesulfonate), metal nanowires, carbon nanotubes, graphene, or metal.

Typically, the electrically conductive layer has an electrical sheet resistance of not greater than 10,000 ohm/square (in some embodiments, not greater than 5,000, 1,000, 750, 500, 400, 300, 200, 100, 50, 25, or even not greater than 10 ohm/square;) in some embodiments, in a range from 10 ohm/square to 10,000 ohm/square, 100 ohm/square to 10,000 ohm/square, 250 ohm/square to 2,500 ohm/square, or even 500 ohm/square to 2,000 ohm/square), although values outside of these typical values are also useful.

In some embodiments, the electrically conductive layer has a thickness in a range from 5 nanometers to 10 micrometers (in some embodiments, in a range from 10 nanometers to 1 micrometer, in a range from 20 nanometers to 500 nanometers, or even 30 nanometers to 250 nanometers), although values outside of these typical values are also useful.

In some embodiments, the electrically conductive layer is patterned and comprises first and second, separated regions (and optionally additional (e.g., third) separated regions), and optionally further comprises a first address trace electrically connected to the first region, and a second address trace electrically connect to the second region (and further, optionally, if a third region is present, a third address trace electrically connect to the third region).

Figure 10:
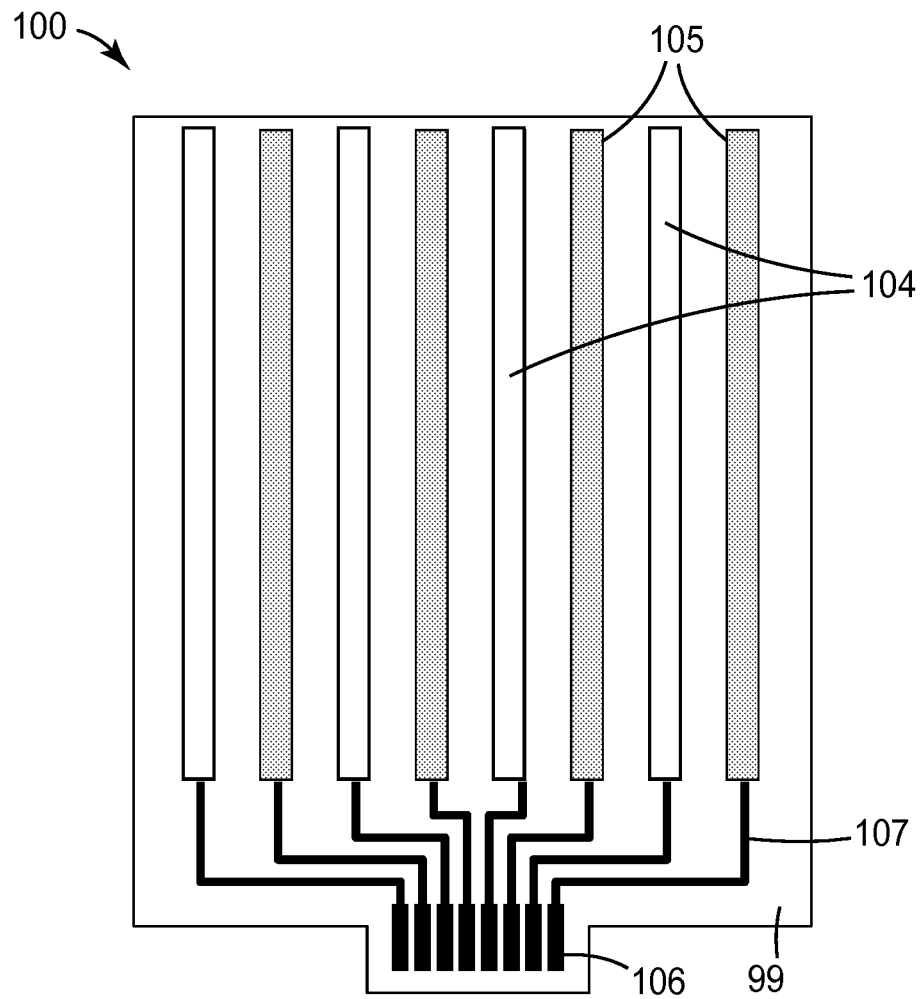

For example, FIG. 10 shows exemplary article 100 comprising regions 104 with electrically conductive metallic traces (e.g., a pattern as shown in any of FIGS. 1-4) (not shown in FIG. 10) on substrate 99, and regions 105 with electrically conductive layer on electrically conductive metallic traces which in turn are on substrate 99. Article 100 also includes contact pads (e.g., 106) electrically connected through address traces (e.g., 107) to regions such as shown in 104 and 105.

Figure 10A:
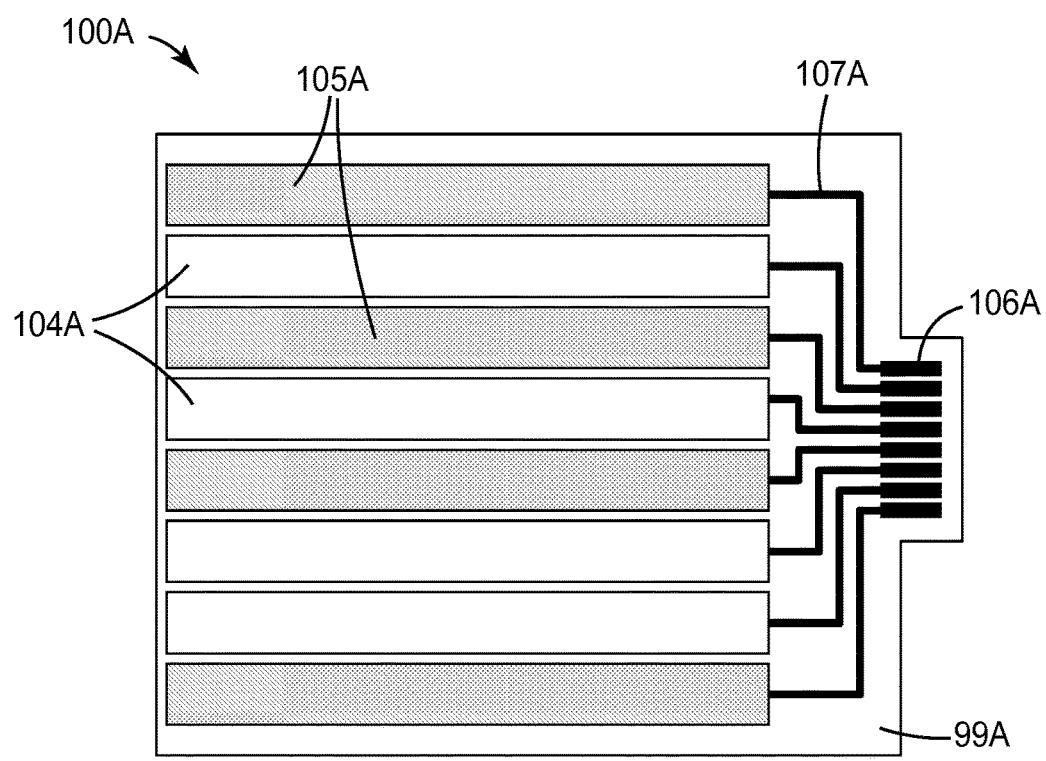

Further, for example, FIG. 10A shows exemplary article 100A comprising regions 104A with electrically conductive metallic traces (e.g., a pattern as shown in any of FIGS. 1-4) (not shown in FIG. 10A) on substrate 99A, and regions 105A with electrically conductive layer on electrically conductive metallic traces which in turn are on substrate 99A. Article 100A also includes contact pads (e.g., 106A) electrically connected through address traces (e.g., 107A) to regions such as shown in 104A and 105A.

In some embodiments, articles described herein are in the form of a roll. As such, the substrate is in the form of a sheet that is sufficiently thin to be rolled onto a core. Polymeric or glass substrates can be sufficiently thin. Such substrates can be transported from an input roll and core, through process equipment, to a take-up roll and core. Processing substrates in such a manner is referred to herein as roll-to-roll. The thickness of substrates that are suitable for roll-to-roll processing, according to methods and articles described herein, are typically in a range from 5 micrometers to 500 micrometers (in some embodiments, in a range from 10 micrometers to 250 micrometers, or even 25 micrometers to 125 micrometers). Exemplary roll-to-roll processing methods herein include coating of an electrically conductive layer on a substrate, direct printing of electrically conductive metallic traces, direct printing of a patterned electrically conductive layer, etching.

In some embodiments, further comprise a liner. A liner is a weakly (removably) bonded (e.g., as achieved through electrostatic attraction) polymer film that can be applied to either or both sides of the substrates described herein. The liner can serve to protect the electrically conductive metallic conductor traces or the electrically conductive layer, especially during process steps, for example, roll-to-roll process steps as described above.

Techniques for providing the electrically conductive metallic traces are known in the art, including microcontact printing (SAM-printing on thin film metal, followed by chemical etching), photolithography (photo-patterning of a photoresist on a metal layer, followed by chemical etching), direct printing (e.g., by gravure printing, flexographic printing, screen printing, offset printing, and inkjet printing).

Techniques for providing the electrically conductive metallic traces are known in the art and include those which yield electrically conductive metallic traces that are inlaid into channels in a substrate, for example as described in U.S. Pat. No. 8,179,381 (Frey et al.). Such techniques may include formation of structured substrates by microreplication, embossing, or nanoimprint lithography, in combination with etching, physical vapor deposition of metal, and plating of metal thereon.

The metal layers that are etched to provide the electrically conductive metallic traces can be deposited, for example, by physical vapor deposition (e.g., sputtering, evaporation), electroless plating, or electrolytic plating. Criteria for selecting the particular metal include the desired electrical sheet resistance of the resulting electrically conductive metallic traces. In some embodiments, it may be desirable to reduce the reflectance of the electrically conductive metallic traces.

Techniques for reducing the reflectance of the electrically conductive metallic traces are known in the art, as described above as darkening.

Exemplary electrically conductive layers comprise electrically conducting oxides (e.g., indium tin oxide, indium zinc oxide, fluorinated tin oxide), carbon nanotube coatings, metal nanowire coatings (e.g., silver, copper, and nickel), graphene, and electrically conducting polymers (e.g., PEDOT-PSS). Techniques for providing the electrically conductive layers are known in the art, including roll coating, slot die coating, sputtering, evaporation, flexographic printing, screen-printing, gravure printing, offset printing, and inkjet printing, as may be applicable to the particular material comprising the layer. Criteria for selecting the particular material for the electrically conductive layer include the desired electrical sheet resistance of the resulting electrically conductive layer.

Exemplary materials for making the contact pads and electrical connections thereto (address traces) include metal particles dispersed in an organic binder (printed inks). Examples of such materials include silver particles dispersed in epoxy polymers. Other useful electrically conductive materials include nanoparticle-containing or nanoparticle-derived materials (e.g., printed inks). Examples of the latter materials include nanoscale silver particle-containing inks. Other useful electrically conductive materials for the contact pads and electrical connections thereto (address traces) include thin film metal (e.g., sputtered) that is patterned (e.g., by photolithography and etching). Where printing is used for patterning the address traces useful printing methods include flexographic printing, gravure printing, screen printing, and inkjet printing.

The geometries of the various components of articles described herein can be modified as needed for a particular application. For example, although the regions of electrically conductive layer are shown in FIGS. 10, 10A, and 12 in the form of straight lines that are arranged as approximately orthogonal linear arrays, the regions could also be curved and arranged so as not to create a repeating array.

Figure 11:
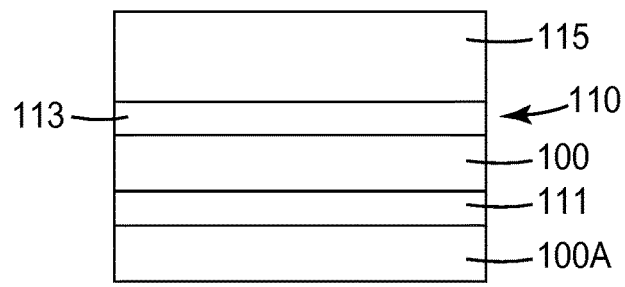
Figure 12:
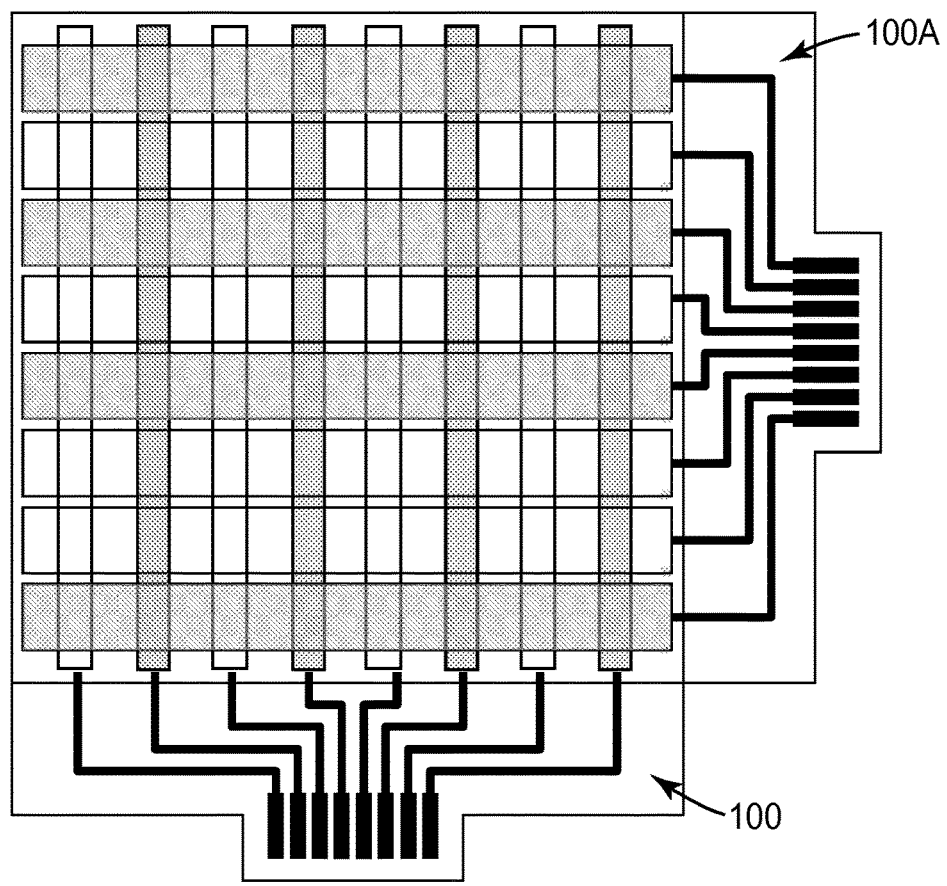
FIG. 12 illustrates a combination of touch screen components that include exemplary articles described herein.

FIGS. 11 and 12 illustrate an exemplary use of articles described herein in a touch screen application. Touch screen component assembly 110 comprises exemplary articles described herein 100, 100A, optically clear adhesive 111, 113, and cover lens 115. The optically clear adhesive serves to fix the sensor layers, thereby assuring their uniform visual appearance, high light transmission (by avoiding material interfaces with air), and stable position (allowing for consistent electrostatic conditions, as a necessary starting point for accurate touch position detection).

One advantage observed with at least some embodiments of articles described herein is that relatively low electrical sheet resistance patterns can be provided by relatively high electrical sheet resistance material, wherein the latter can have relatively low pattern visibility of the electrically conductive metallic traces due to their generally small impact on substrate optical properties. For example, a conventional electrically conducting polymer marketed under the trade designation "CLEVIOS" (poly(3,4-ethylenedioxythiophene)-poly(styrenesulfonate), also known as PEDOT-PSS) on poly(ethyleneterephthalate) has been reported by Ron Lubianez, a Heraeus KG Conductive Polymers Division (Clevios), Leverkusen, Germany) representative at 2012FLEX Flexible Electronics and Displays Conference and Exhibition, Feb. 6-9, 2012, Phoenix, Arizona to exhibit 91.7% light transmittance (on par with the PET base film itself) at 350 ohm/sq. Exemplary embodiments of articles described herein can be generated with the visibility attributes of a 350 ohm/sq. conductor, but with electrical sheet resistance that is less than 100 ohm/sq.

Methods and/or articles described herein have, as compared to for example micro-contact printed touch sensors, advantages that include relatively low cost tooling, shorter acquisition times to obtain the tooling for a particular design, and relatively low electrical sheet resistance with low visibility to the transparent conductor pattern. Generally, selected desirable characteristics of methods and/or articles described herein that are comparable to those for conventional printed electrically conducting polymer, carbon nanotube, and nanowire touch sensors, include relatively low cost tooling, relatively short acquisition times to obtain the tooling for a particular design; and low electrical sheet resistance with low visibility to the electrically conductive trace pattern.

Embodiments of articles described herein are useful, for example, displays, touch sensors, lighting elements (e.g., light emitting diodes (e.g., organic light emitting diodes)), photovoltaic cells, electrochromic windows and displays, and electroluminescent lamps and displays).

Exemplary Embodiments

1. An Article comprising:
    a substrate having a first major surface;
    an electrical conductor pattern on the first major surface of the substrate, the electrical conductor pattern comprising:
        a plurality of separated pairs of separated first and second electrically conductive metallic traces, the first and second electrically conductive metallic traces of each pair of the plurality of pairs having a length of overlap relative to each other of at least 5 (in some embodiments at least 10, 25, 50, or 100; or in a range from 5 to 1,000, 10 to 500, 15 to 250, or even 50 to 200) times their separation distance, and wherein there are at least 50 (in some embodiments, at least 75, 100, 150, 200, 250, 500, 1,000, 5,000, 10,000, 25,000, 50,000, 75,000, 100,000, or even at least 150,000; in some embodiments, in a range from 100 to 150,000, 500 to 150,000, 1,000 to 150,000, 5,000 to 150,000, 10,000 to 150,000, or even 25,000 to 150,000) of the electrically conductive metallic traces/cm$^2$.
2. The article of Exemplary Embodiment 1, wherein adjacent electrically conductive metallic traces of adjacent pairs within the plurality have a length of overlap relative to each other of at least 5 (in some embodiments, in a range from 5 to 1,000, 10 to 500, 15 to 250, or even 50 to 200) times their separation distance.
3. The article of Exemplary Embodiment 1, wherein the electrical conductor pattern has an open area fraction greater than 80, 90, 95, 96, 97, 98, 99, or even at least 99.5%; in some embodiments, in a range from 80 to 99.75%, 90 to 99.75%, 90 to 99.5%, 95 to 99.75%, or even 95 to 99.5%).
4. The article of any preceding Exemplary Embodiment, wherein each electrically conductive metallic trace of a pair is separated from each other by up to 100 micrometers (in some embodiments, up to 75, 50, 25, 15, 10, 5, 4, 3, 2, 1, 0.75, 0.5, or even up to 0.25 micrometer; in some embodiments, in a range from greater than zero to 100 micrometers, 0.5 micrometer to 50 micrometers, 0.5 micrometer to 25 micrometers, 0.5 micrometer to 15 micrometer, 0.5 micrometer to 10 micrometers, 0.5 micrometer to 5 micrometers, 0.75 micrometer to 3 micrometers, or even 1 micrometer to 2 micrometers).
5. The article of any preceding Exemplary Embodiment, wherein the electrically conductive metallic traces have widths not greater than 25 micrometers (in some embodiments, not greater than 15, 10, 5, 4, 4, 2, or even not greater than 1 micrometer; in some embodiments, in a range from 0.1 micrometer to 25 micrometers, 0.25 micrometer to 10 micrometers, 0.5 micrometer to 5 micrometers, or even 0.75 micrometer to 25 micrometers).
6. The article of any preceding Exemplary Embodiment, wherein there are at least 1,000 (in some embodiments, at least 5,000, 10,000, 25,000, 50,000, 75,000, 100,000, 500,000, 1,000,000, 5,000,000, or even at least 10,000,000) pairs of the electrically conductive metallic traces.
7. The article of any preceding Exemplary Embodiment, wherein the electrically conductive metallic traces have lengths of at least 5 micrometers (in some embodiments, at least 10, 25, 50, 75, 100, 250, 500, 1,000, 5,000, 10,000, 25,000, or even at least 50,000 micrometers; in some embodiments in a range from 100 micrometers to 500 micrometers).
8. The article of any preceding Exemplary Embodiment, wherein the length of overlap of the electrically conductive metallic traces of a pair is at least 5 micrometers (in some embodiments, at least 10, 25, 50, 100, 250, 500, 1,000, 10,000, 25,000, 50,000 micrometers; in some embodiments, in a range from, 5 micrometers to 9 mm, 10 micrometers to 1 mm, 250 micrometers to 500 micrometers, 25 micrometers to 500 micrometers, or even 30 micrometers to 300 micrometers).
9. The article of any preceding Exemplary Embodiment, the electrically conductive metallic traces have an electrical sheet resistance of not greater than 5 ohm/square (in some embodiments, not greater than 2, 1, 0.5, 0.4, 0.3, 0.2, 0.1, 0.05, 0.025, 0.01, 0.05, or even not greater than 0.01 ohm/square).
10. The article of any preceding Exemplary Embodiment, wherein the electrically conductive metallic traces are darkened.
11. The article of any preceding Exemplary Embodiment, wherein the electrically conductive metallic traces comprise at least one of silver, gold, palladium, aluminum, nickel, molybdenum, tungsten, chromium, copper, tin, or nickel.
12. The article of any preceding Exemplary Embodiment, wherein the substrate is transparent.
13. The article of any preceding Exemplary Embodiment, wherein the substrate is glass.
14. The article of any preceding Exemplary Embodiment, wherein the substrate is a polymer film.
15. The article of Exemplary Embodiment 14, wherein the polymer film is selected from the group consisting of poly(ethyleneterephthalate), cyclic olefin polymer, poly(ethylenenaphthalate), polycarbonate, cellulose triacetate, and cyclic polyolefin copolymer.
16. The article of any preceding Exemplary Embodiment, wherein the first and second electrically conductive metallic traces are linear.
17. The article of any of Exemplary Embodiments 1 to 15, wherein the first and second electrically conductive metallic traces are non-linear.
18. The article of any of any preceding Exemplary Embodiment, wherein the first and second electrically conductive metallic traces are branched.

19. The article of any of Exemplary Embodiments 1 to 17, wherein the first and second electrically conductive metallic traces are non-branched.
20. The article of any preceding Exemplary Embodiment, wherein the plurality of pairs of first and second electrically conductive metallic traces generally form a repeating pattern.
21. The article of any preceding Exemplary Embodiment, wherein the plurality of pairs of first and second electrically conductive metallic traces generally form a repeating series of lines.
22. The article of any Exemplary Embodiments 1 to 20, wherein the plurality of pairs of first and second electrically conductive metallic traces generally form a grid.
23. The article of any of Exemplary Embodiments 1 to 20, wherein the plurality of pairs of first and second electrically conductive metallic traces generally form a repeating pattern of hexagons.
24. The article of any of Exemplary Embodiments 1 to 20, wherein the plurality of pairs of first and second electrically conductive metallic traces generally form a pseudo-random two-dimensional network.
25. The article of any preceding Exemplary Embodiment, wherein the first and second electrically conductive metallic traces have a thickness in a range from 10 nanometers to 20 micrometers (in some embodiments, in a range from 20 nanometers to 5 micrometers, 30 nanometers to 1 micrometer, 40 nanometers to 500 nanometers, or even 50 nanometers to 400 nanometers).
26. The article of any preceding Exemplary Embodiment, wherein for at least a portion of the pairs of first and second metallic conductive metallic traces are complementarily tapered relative to each other.
27. The article of any preceding Exemplary Embodiment further comprising an electrically conductive layer having first and second generally opposed major surfaces, wherein a major surface of the electrically conductive layer is in contact with at least a portion (in some embodiments at least 1, 2, 3, 4, 5, 10, 15, 20, 25, 30, 35, 40, 45, 50, 55, 60, 65, 70, 75, 80, 85, 90, 95, 99, or even 100 percent of the plurality of pairs of first and second electrically conductive metallic traces generally parallel with the of the first major surface of the substrate) of the plurality of pairs of first and second electrically conductive metallic traces.
28. The article of Exemplary Embodiment 27, wherein the electrically conductive layer is disposed between the substrate and the plurality of pairs of first and second electrically conductive metallic traces.
29. The article of Exemplary Embodiment 27, wherein the plurality of pairs of first and second electrically conductive metallic traces is disposed between the substrate and the electrically conductive layer.
30. The article of any of Exemplary Embodiments 27 to 29, wherein the electrically conductive layer is transparent.
31. The article of Exemplary Embodiment 30, wherein the electrically conductive layer comprises at least one of metal oxide (e.g., indium tin oxide), electrically conducting polymer (e.g., poly(3,4-ethylenedioxythiophene)-poly(styrenesulfonate), metal nanowires, carbon nanotubes, graphene, or metal).
32. The article of any of Exemplary Embodiments 27 to 31, wherein the electrically conductive layer has an electrical sheet resistance of not greater than 10,000 ohm/square (in some embodiments, not greater than 5,000, 1,000, 750, 500, 400, 300, 200, 100, 50, 25, or even not greater than 10 ohm/square).
33. The article of any of Exemplary Embodiments 27 to 32, wherein the electrically conductive layer has a thickness in a range from 5 nanometers to 10 micrometers (in some embodiments, in a range from 10 nanometers to 1 micrometer, in a range from 20 nanometers to 500 nanometers, or in a range from 30 nanometers to 250 nanometers).
34. The article of any of Exemplary Embodiments 27 to 33, wherein the electrically conductive layer is patterned and comprises first and second, separated regions.
35. The article of Exemplary Embodiment 34, further comprising a third region separated from the first and second regions.
36. The article of Exemplary Embodiment 35, further comprising a first address trace electrically connected to the first region, and a second address trace electrically connect to the second region.
37. The article of Exemplary Embodiment 36, further comprising a third address trace electrically connected to the third region.
38. The article of Exemplary Embodiment 34, further comprising a first address trace electrically connected to the first region, and a second address trace electrically connect to the second region.
39. A display comprising the article of any preceding Exemplary Embodiment.
40. A touch sensor comprising the article of any of Exemplary Embodiments 1 to 38.
41. A lighting element comprising the article of any of Exemplary Embodiments 1 to 38.
42. The lighting element of Exemplary Embodiment 41, wherein the lighting element includes a light emitting diode.
43. The lighting element of either Exemplary Embodiment 41 or 42, wherein the lighting element includes an organic light emitting diode.
44. The article of any of Exemplary Embodiments 27 to 29, wherein the electrically conductive layer is opaque.
45. The article of Exemplary Embodiment 44, wherein the electrically conductive layer comprises at least one of copper, silver, aluminum, gold, nickel, tungsten, or molybdenum.
46. The article of any of Exemplary Embodiments 1 to 38, 44, or 45 in the form of a roll.
47. The article of any of Exemplary Embodiments 1 to 38 or 44 to 46, further comprising a removable liner.
48. A method of making an article of any of Exemplary Embodiments 1 to 26, the method comprising:
providing a substrate having a first major surface; and
depositing a plurality of separated pairs of separated first and second electrically conductive metallic traces onto the first major surface of the substrate to provide the article.
49. The method of Exemplary Embodiment 48, wherein depositing the plurality of separated pairs of separated first and second electrically conductive metallic traces is via direct printing.
50. The method of either Exemplary Embodiment 48 or 49, further comprising depositing an electrically conductive layer onto the plurality of first and second electrically conductive metallic traces.
51. The method of Exemplary Embodiment 50, wherein the electrically conductive layer is transparent.
52. The method of either Exemplary Embodiment 50 or 51, wherein the depositing the electrically conductive layer is via direct printing.

53. The method of any of Exemplary Embodiments 48 to 52 wherein the article is in the form of a roll.

54. A method of making an article of any of Exemplary Embodiments 1 to 26, the method comprising:
providing a substrate having a first major surface;
providing a metal layer onto the first major surface of the substrate; and
etching a metal layer to provide a plurality of separated pairs of separated first and second electrically conductive metallic traces on the first major surface of the substrate to provide the article.

55. The method of Exemplary Embodiment 54, further comprising depositing an electrically conductive layer onto the plurality of first and second electrically conductive metallic traces.

56. The method of Exemplary Embodiment 55, wherein the depositing the electrically conductive layer is via direct printing.

57. The method of either Exemplary Embodiment 54 or 55, wherein the electrically conductive layer is transparent.

58. The method of any of Exemplary Embodiments 54 to 57, wherein the article is in the form of a roll.

59. A method of making an article of Exemplary Embodiment 28, the method comprising:
providing a substrate having a first major surface;
depositing a first electrically conductive layer onto the first major surface;
depositing a plurality of separated pairs of separated first and second electrically conductive metallic traces onto the electrically conductive layer to provide the article.

60. The method of Exemplary Embodiment 59, wherein the first electrically conductive layer is transparent.

61. The method of either Exemplary Embodiment 59 or 60, wherein the depositing the first electrically conductive layer is via direct printing.

62. The method of any of Exemplary Embodiments 59 to 61, further comprising depositing a second electrically conductive layer onto the plurality of first and second electrically conductive metallic traces.

63. The method of Exemplary Embodiment 62, wherein the depositing the second electrically conductive layer is via direct printing.

64. The method of either Exemplary Embodiments 62 or 63, wherein the second electrically conductive layer is transparent.

65. The method of any of Exemplary Embodiments 59 to 63 wherein the article is in the form of a roll.

66. A method of making an article of Exemplary Embodiment 28, the method comprising:
providing a substrate having a first major surface;
depositing an electrically conductive layer onto the first major surface;
depositing a metal layer onto the electrically conductive layer to provide the article; and
etching the metal layer to provide a plurality of separated pairs of separated first and second electrically conductive metallic traces on the first major surface of the substrate to provide the article.

67. The method of Exemplary Embodiment 66, wherein the electrically conductive layer is transparent.

68. The method of either Exemplary Embodiment 66 or 67, wherein the depositing the electrically conductive layer is via direct printing.

69. The method of any of Exemplary Embodiments 66 to 68, wherein the depositing the metal layer is via direct printing.

70. The method of any of Exemplary Embodiments 66 to 69, wherein the article is in the form of a roll.

Advantages and embodiments of this invention are further illustrated by the following examples, but the particular materials and amounts thereof recited in these examples, as well as other conditions and details, should not be construed to unduly limit this invention. All parts and percentages are by weight unless otherwise indicated.

EXAMPLES

All of the examples described below are based on theoretical calculations of expected electrical properties for different geometries of primary electrical conductor traces. The electrical sheet resistance of hybrid transparent conductors (e.g., for a first region, according to FIGS. 2, 2A, 6, and 6A) were estimated by simulating the electrical resistance across a unit cell of the hybrid electrical conductor that can be generated by replicating that unit cell in two dimensions. Hybrid conductor refers to the combination of a primary electrical conductor (a plurality of separated pairs of separated first and second electrically conductive metallic traces) and a secondary electrical conductor (an electrically conductive layer). The analysis included two steps: (1) a first electrical sheet resistance was determined for the primary electrical conductor (metal traces) in combination with the portion of secondary electrical conductor (e.g., transparent electrical conductor) that resides between closely spaced, parallel primary electrically conductive traces (see FIG. 2A); and (2) a "total" electrical sheet resistance was calculated by starting with the output of Step 1 and considering that "Step 1 electrical sheet conductor" to exist in parallel with the remainder of secondary electrical conductor that resides outside the locations between closely spaced, parallel primary electrically conductive traces ($1/R_{S\text{-}total} = 1/R_{S\text{-}step1} + 1/R_{S\text{-}secondary}$). For simplicity, a generally square grid arrangement of primary electrically conductive branched traces was considered for the analysis, as illustrated in FIG. 2. In such case, the electrical resistance between nodes (or vertices) can be taken as the electrical sheet resistance of the Step 1 electrical sheet conductor (closely spaced, parallel primary electrically conductive traces in combination with the portion of the secondary electrical conductor that resides between the closely spaced electrically conductive traces).

In order to establish high confidence in the results of simulations, the first step above was carried out by two different methods. In the first method (using software obtained under the trade designation "LTSPICE IV," from Linear Technology Corporation, Milpitas, Calif.) Simulation Program with Integrated Circuit Emphasis ("SPICE") was used to calculate the sheet resistance of the transparent electrically conductive material according to each example design. Inputs into the SPICE software were generated using software obtained under the trade designation, "MATLAB," from MathWorks, Inc., Natick, Mass., with each material design being represented by an equivalent circuit of resistive elements. The inputs to the MATLAB program included cell size, overlap length, trace width, trace spacing, conductor electrical resistance, and transparent electrical conductor resistance. The output was a text based SPICE file that represented the structure electrically. The granularity of the electrical components was broken down electrically with a 1 micrometer mesh. The resulting electrical circuit was run with the SPICE software using a theoretical DC (Direct Current) supply. The resulting theoretical current draw from the SPICE software simulation was used to determine the ohms/sq. of the structure. In the second method (designated "Finite Element Analysis" herein), a finite element modeling software (obtained under the trade designation "COMSOL MULTIPHYSICS" from COMSOL, Inc., Burlington, Mass., with the AC/DC Module, was used. Using the "COMSOL MULTIPHYSICS" software, theoretical models were generated which included the metallic traces (primary conductor, typically shown as horizontal in the noted FIGS.) as well as the transparent (secondary) electrical conductor between the electrically conductive metal traces. Given the geometry and electrical sheet resistances of the two materials, a theoretical voltage difference was applied between the two primary electrical conductor ends (i.e., nodes $N_1$, $N_2$, $N_{5A1}$, $N_{5A2}$, $N_{5B1}$, $N_{5B2}$, in the noted FIGS. 2A, 5A, 5B), and the current density was computed. Dividing the integral of the current density (i.e., the current) by the applied voltage resulted in the effective electrical sheet resistance for each example case ($R_{S\text{-}step1}$). For the theoretical results presented herein, the secondary electrical conductor outside the closely spaced, parallel primary electrically conductive traces was not included in the models, but its effect was instead calculated as shown above to obtain ($R_{S\text{-}total}$). However, for two examples, this secondary electrical conductor was included in a simulation using the "COMSOL" software, leading to theoretical confirmation that the simple parallel electrical resistor formula was a good approximation. Although not wanting to be bound by theory, it is believed that small differences in the results were due to additional fringing current at the tips of the primary electrically conductive traces.

Calculated Examples 1-7

Theoretical effective electrical sheet resistances ("Effective Rs") were calculated for hybrid transparent conductors. The hybrid transparent electrical conductors of these theoretical examples may be considered as the electrical conductors that are present for an article described in FIGS. 6 and 6A. The approximately square arrangement of branched electrically conductive traces, as depicted in FIGS. 2, 2A, 6, and 6A, was used for these calculations, as described above. The spacing between parallel segments of adjacent electrically conductive traces was varied between 0.1 and 10 micrometers. Other parameters of the electrical conductor designs are given in Table 1 below), together with calculation results.

TABLE 1

Trace Spacing Study

| | | Example No. | | | | | | |
|---|---|---|---|---|---|---|---|---|
| | | 1 | 2 | 3 | 4 | 5 | 6 | 7 |
| Primary Conductor Trace Width (micrometer) | | 1 | 1 | 1 | 1 | 1 | 1 | 1 |
| Trace Spacing (micrometers) | | 0.1 | 1 | 2 | 3 | 4 | 5 | 10 |
| Cell Size/Node Separation (micrometers) | | 300 | 300 | 300 | 300 | 300 | 300 | 300 |
| Overlap Length (micrometers) | | 290 | 290 | 290 | 290 | 290 | 290 | 290 |
| Secondary (Transparent) Conductor Rs (ohm/sq.) | | 1000 | 1000 | 1000 | 1000 | 1000 | 1000 | 1000 |
| Trace Rs (ohm/sq.) | | 0.4 | 0.4 | 0.4 | 0.4 | 0.4 | 0.4 | 0.4 |
| Trace Micropattern Open Area Fraction | | 98.72% | 98.72% | 98.72% | 98.72% | 98.72% | 98.72% | 98.72% |
| Calculated Resistance (ohm) = Effective Rs (ohm/sq.) | SPICE Simulation | 62.1 | 70.4 | 75.8 | 80.0 | 83.3 | 87.0 | 102.1 |
| | Finite Element Analysis | 62.2 | 70.4 | 75.3 | 79.2 | 82.6 | 85.8 | 100.5 |

The theoretical electrical sheet resistance of the primary conductor (0.4 ohm/sq.) was consistent with a physical thickness of approximately 105 nanometers for sputtered silver (at effective bulk electrical resistivity of 4.25 microohm-cm). The secondary conductor may be any transparent conductor having the specified electrical sheet electrical resistance (e.g., ITO, carbon nanotube coating, metal (e.g., Ag) nanowire coating, electrically conducting polymer (e.g., PEDOT-PSS), or graphene). The electrical conductors described above may be deposited on a major surface of, for example, a PET film (available, for example, under the trade designation "ST580" from Dupont Teijin Films, Chester, Va.). Furthermore, such a film may, for example, take the form of a patterned touch sensor element as shown in FIGS. 10-12.

Relative to touch sensors having designs as shown in FIGS. 10-12, there may be a concern about capacitive coupling between adjacent transparent electrically conductive bars, due to coupling that may occur between closely spaced electrically conductive trace segments in the electrically non-conductive regions. The capacitive coupling (crosstalk) between adjacent electrical conductors could be detrimental to touch screen functionality. In order to investigate this capacitive coupling, further simulations were run using the SPICE software, but this time modified to use capacitance between the parallel segments of conductor. The Co-Planar Stripline (CPS) equation was used within MATLAB software to determine the theoretical capacitance of the structure, which was in turn distributed along the trace pairs, within the SPICE software model. The circuit was simulated using a AC Current supply of 1 Amp. Driving with 1 Amp allowed the resulting voltage to be taken as the resulting impendence (numerical value). Theoretical AC analysis was performed from 100 kHz to 1 MHz to show resulting impedance. The capacitance resulted in a majority of the final impedance so the decision was made to look at the capacitance as one component instead of distributing it using SPICE software. Finally, theoretical crosstalk for the structures reported herein was compared to the same for a commercialized ITO-based projected capacitive touch sensor, in order to estimate the likelihood that such crosstalk could defeat the functionality of the new structures in a projected capacitive touch sensor. The theoretical results from this comparison show the capacitive coupling of a sensor design using the current approach. As reported in Table 2 (below), the new design approach reported herein shows similar crosstalk to existing designs.

TABLE 2

| Design | Layer | Capacitance (F) |
|---|---|---|
| Prior Art Design | Drive | 3.82E−14 |
| Prior Art Design | Receive | 6.01E−15 |
| Currently Reported Design | Worst Case | 1.26E−14 |
| Currently Reported Design | Receive | 9.48E−16 |

Calculated Examples 8-12

Theoretical effective electrical sheet resistance ("Effective Rs") was calculated for exemplary hybrid transparent conductors described herein. The hybrid transparent electrical conductors of these theoretical examples may be considered as the electrical conductors shown in the article described in FIGS. 6 and 6A. The approximately square arrangement of branched electrically conductive traces, as depicted in FIGS. 2, 2A, 6, and 6A, was used for these calculations, as described above. The point-to-point separation distance, or pitch (also referred to herein as "cell size"), and electrically conductive trace width were varied. Other parameters of the electrically conductive conductor designs are given in Table 3 (below), together with calculation results.

TABLE 3

Cell Size vs. Trace Width Study

| | | Example No. | | | | |
|---|---|---|---|---|---|---|
| | | 8 | 9 | 10 | 11 | 12 |
| Primary Conductor Trace Width (micrometers) | | 1 | 1 | 1 | 2 | 3 |
| Trace Spacing (micrometer) | | 1 | 1 | 1 | 1 | 1 |
| Cell Size/Node Separation (micrometers) | | 100 | 200 | 400 | 300 | 300 |
| Overlap Length (micrometers) | | 90 | 190 | 390 | 290 | 290 |
| Secondary (Transparent) Conductor Rs (ohm/sq.) | | 1000 | 1000 | 1000 | 1000 | 1000 |
| Trace Rs (ohm/sq.) | | 0.4 | 0.4 | 0.4 | 0.4 | 0.4 |
| Trace Micropattern Open Area Fraction | | 96.44% | 98.11% | 99.03% | 97.44% | 96.17% |
| Calculated Resistance (ohm) = Effective Rs (ohm/sq.) | SPICE Simulation | 37.0 | 53.2 | 87.7 | 39.3 | 28.0 |
| | Finite Element Analysis | 36.6 | 52.9 | 87.3 | 39.2 | 28.0 |

The electrical sheet resistance of the primary conductor (0.4 ohm/sq.) is consistent with a physical thickness of approximately 105 nanometers for sputtered silver (at effective bulk electrical resistivity of 4.25 microohm-cm). The secondary electrical conductor may be any transparent electrical conductor having the specified electrical sheet resistance (e.g., ITO, carbon nanotube coating, metal (e.g., Ag) nanowire coating, electrically conducting polymer (e.g., PEDOT-PSS), graphene). The electrical conductors described above may be deposited on a major surface of a PET film (e.g., "ST580"). Furthermore, such a film may take the form of a patterned touch sensor element shown in FIGS. 10-12.

Calculated Examples 13-16

Theoretical effective electrical sheet resistance ("Effective Rs") was calculated for hybrid transparent electrical conductors of exemplary embodiments of articles described herein. The hybrid transparent electrical conductors of these theoretical examples may be considered as the electrical conductors that are present for an article described in FIGS. 6 and 6A. The approximately square arrangement of branched electrical traces, as depicted in FIGS. 2, 2A, 6, and 6A, was used for these calculations, as described above. The electrical sheet resistance of the secondary (transparent) electrical conductor was varied. Other parameters of the electrical conductor designs are given in Table 4 (below), together with calculation results.

TABLE 4

Transparent Conductor Sheet Resistance Study

| Example No. | | 13 | 14 | 15 | 16 |
|---|---|---|---|---|---|
| Primary Conductor Trace Width (micrometer) | | 1 | 1 | 1 | 1 |
| Trace Spacing (micrometer) | | 1 | 1 | 1 | 1 |
| Cell Size/Node Separation (micrometers) | | 300 | 300 | 300 | 300 |
| Overlap Length (micrometers) | | 290 | 290 | 290 | 290 |
| Secondary (Transparent) Conductor Rs (ohm/sq.) | | 1000 | 750 | 500 | 250 |
| Trace Rs (ohm/sq.) | | 0.4 | 0.4 | 0.4 | 0.4 |
| Trace Micropattern Open Area Fraction | | 98.72% | 98.72% | 98.72% | 98.72% |
| Calculated Resistance (ohm) = Effective Rs (ohm/sq.) | SPICE Simulation | 70.4 | 67.4 | 62.9 | 54.1 |
| | Finite Element Analysis | 70.4 | 67.2 | 62.6 | 53.8 |

The electrical sheet resistance of the primary electrical conductor (0.4 ohm/sq.) is consistent with a physical thickness of approximately 105 nanometers for sputtered silver (at effective bulk electrical resistivity of 4.25 microohm-cm). The secondary electrical conductor may be any transparent electrical conductor having the specified electrical sheet resistance (e.g., ITO, carbon nanotube coating, metal (e.g., Ag) nanowire coating, electrically conducting polymer (e.g., PEDOT-PSS), graphene). The electrical conductors described above may be deposited on a major surface of a PET film (e.g., "ST580"). Furthermore, such a film may take the form of a patterned touch sensor element shown in FIGS. 10-12.

Calculated Examples 17-20

Theoretical effective electrical sheet resistance ("Effective Rs") was calculated for hybrid transparent conductors of exemplary embodiments of articles described herein. The hybrid transparent electrical conductors of these theoretical examples may be considered as the electrical conductors that are present for an article described in FIGS. 6 and 6A. The approximately square arrangement of branched electrical traces, as depicted in FIGS. 2, 2A, 6, and 6A, was used for these calculations, as described above. The electrical sheet resistance of the primary (metal trace) electrical conductor was varied from 0.5 ohm/sq. to 0.1 ohm/sq. This range of electrical sheet resistance is consistent with a physical thickness range for sputtered silver of 85 nanometers (at effective bulk electrical resistivity of 4.25 microohm-cm) to 360 nanometers (at an effective bulk resistivity of 3.6 microohm-cm), respectively. Other parameters of the electrical conductor designs are given in Table 5 (below), together with calculation results.

TABLE 5

Trace Sheet Resistance Study

| Example No. | 17 | 18 | 19 | 20 |
|---|---|---|---|---|
| Primary Conductor Trace Width (micrometer) | 1 | 1 | 1 | 1 |
| Trace Spacing (micrometer) | 1 | 1 | 1 | 1 |
| Cell Size/Node Separation (micrometers) | 300 | 300 | 300 | 300 |
| Overlap Length (micrometers) | 290 | 290 | 290 | 290 |
| Secondary (Transparent) Conductor Rs (ohm/sq.) | 1000 | 1000 | 1000 | 1000 |

PEDOT-PSS), graphene). The electrical conductors described above may be deposited on a major surface of a PET film (e.g., "ST580"). Furthermore, such a film may take the form of a patterned touch sensor element shown in FIGS. 10-12.

Calculated Examples 21-26

Theoretical effective electrical sheet resistance ("Effective Rs") was calculated for hybrid transparent electrical conductors of exemplary embodiments of articles described herein. The hybrid transparent electrical conductors of these theoretical examples may be considered as the electrical conductors that are present for an article described in FIGS. 6 and 6A. The approximately square arrangement of branched electrically conductive traces, as depicted in FIGS. 2, 5A, 6, and 6A, was used for these calculations, as described above. The electrically conductive traces had tapered width, as listed in Table 6 (below).

TABLE 6

"Wedge" Trace Shape Study

| | Example No. | | | | | |
|---|---|---|---|---|---|---|
| | 21 | 22 | 23 | 24 | 25 | 26 |
| Primary Conductor Trace Width (micrometer) | 1.75 --> 0.25 | 1.5 --> 0.5 | 1.25 --> 0.75 | 1.0 --> 1.0 | 0.75 --> 1.25 | 0.5 --> 1.5 |
| Trace Spacing (micrometer) | 1 | 1 | 1 | 1 | 1 | 1 |
| Cell Size/Node Separation (micrometers) | 300 | 300 | 300 | 300 | 300 | 300 |
| Overlap Length (micrometers) | 290 | 290 | 290 | 290 | 290 | 290 |
| Secondary (Transparent) Conductor Rs (ohm/sq.) | 1000 | 1000 | 1000 | 1000 | 1000 | 1000 |
| Trace Rs (ohm/sq.) | 0.4 | 0.4 | 0.4 | 0.4 | 0.4 | 0.4 |
| Trace Micropattern Open Area Fraction | 98.72% | 98.72% | 98.72% | 98.72% | 98.72% | 98.72% |
| Calculated Resistance (ohm) = Effective Rs (ohm/sq.) SPICE Simulation | 61.5 | 63.4 | 66.2 | 70.6 | 76.3 | 87.1 |
| Finite Element Analysis | 61.4 | 63.2 | 66.1 | 70.3 | 76.4 | 86.4 |

TABLE 5-continued

Trace Sheet Resistance Study

| Example No. | 17 | 18 | 19 | 20 |
|---|---|---|---|---|
| Trace Rs (ohm/sq.) | 0.5 | 0.3 | 0.2 | 0.1 |
| Trace Micropattern Open Area Fraction | 98.72% | 98.72% | 98.72% | 98.72% |
| Calculated Resistance (ohm) = Effective Rs (ohm/sq.) SPICE Simulation | 85.2 | 55.4 | 39.4 | 22.3 |
| Finite Element Analysis | 84.9 | 55.2 | 39.2 | 22.2 |

The secondary electrical conductor may be any transparent electrical conductor having the specified electrical sheet resistance (e.g., ITO, carbon nanotube coating, metal (e.g., Ag) nanowire coating, electrically conducting polymer (e.g., The tapered design for electrically conductive trace width is also described herein as a wedge design for the electrically conductive traces. The primary electrically conductive trace width notation in Table 6 (above) refers to the progression in electrically conductive trace width from the vertex to the end of the electrically conductive trace, extending away from the vertex, in FIG. 5A. The electrical sheet resistance of the primary electrical conductor (0.4 ohm/sq.) is consistent with a physical thickness of approximately 105 nanometers for sputtered silver (at effective bulk electrical resistivity of 4.25 microohm-cm). Other parameters of the electrical conductor designs are given in Table 6 (above), together with calculation results. The secondary electrical conductor may be any transparent electrical conductor having the specified electrical sheet resistance (e.g., ITO, carbon nanotube coating, metal (e.g., Ag) nanowire coating, electrically conducting polymer (e.g., PEDOT-PSS), graphene). The electrical conductors described above may be deposited on a major surface of a PET film (e.g., "ST580"). Furthermore, such a film may take the form of a patterned touch sensor element shown in FIGS. 10-12.

Calculated Examples 27-32

Theoretical effective electrical sheet resistance ("Effective Rs") was calculated for hybrid transparent electrical conductors of exemplary embodiments of articles described herein. The hybrid transparent electrical conductors of these theoretical examples may be considered as the electrical conductors that are present for an article described in FIGS. 6 and 6A. The approximately square arrangement of branched and non-branched electrically conductive traces, as depicted in FIGS. 2, 5B, 6, and 6A, was used for these calculations, as described above. The electrically conductive traces had selected breaks, as listed in Table 7 and shown schematically in FIG. 5B. The electrical sheet resistance of the primary electrical conductor (0.4 ohm/sq.) is consistent with a physical thickness of approximately 105 nanometers for sputtered silver (at effective bulk electrical resistivity of 4.25 microohm-cm). Other parameters of the electrical conductor designs are given in Table 7 (below), together with calculation results.

resistance (e.g., ITO, carbon nanotube coating, metal (e.g., Ag) nanowire coating, electrically conducting polymer (e.g., PEDOT-PSS), graphene. The electrical conductors described above may be deposited on a major surface of a PET film (e.g., "ST580"). Furthermore, such a film may take the form of a patterned touch sensor element shown in FIGS. 10-12.

Calculated Examples 33-38

Theoretical effective electrical sheet resistance ("Effective Rs") was calculated for hybrid transparent electrical conductors of exemplary embodiments of articles described herein. The hybrid transparent electrical conductors of these theoretical examples may be considered as the electrical conductors that are present for an article described in FIGS. 6 and 6A. The approximately square arrangement of branched electrically conductive traces, as depicted in FIGS. 2, 5B, 6, and 6A, was used for these calculations, as described above. The electrically conductive traces had

TABLE 7

Break Distribution Study #1 - "High-Rs"

| | Example No. | | | | | |
|---|---|---|---|---|---|---|
| | 27 | 28 | 29 | 30 | 31 | 32 |
| Primary Conductor Trace Width (micrometer) | 1 | 1 | 1 | 1 | 1 | 1 |
| Trace Spacing (micrometer) | 1 | 1 | 1 | 1 | 1 | 1 |
| Pitch - (Cell Size/Node Separation) (micrometers) | 300 | 300 | 300 | 300 | 300 | 300 |
| No. of Complete Segments (+½ segment per pitch) | 1 | 2 | 4 | 1 | 2 | 4 |
| Gap Size (micrometers) | 2 | 2 | 2 | 5 | 5 | 5 |
| Complete Segment Length (micrometers) | 198 | 118 | 64.67 | 195 | 115 | 61.67 |
| Overlap Length (micrometers) | 98 | 58 | 31.33 | 95 | 55 | 28.33 |
| Secondary (Transparent) Conductor Rs (ohm/sq.) | 1000 | 1000 | 1000 | 1000 | 1000 | 1000 |
| Trace Rs (ohm/sq.) | 0.4 | 0.4 | 0.4 | 0.4 | 0.4 | 0.4 |
| Trace Micropattern Open Area Fraction | 98.68% | 98.69% | 98.71% | 98.69% | 98.72% | 98.76% |
| Calculated Resistance (ohm) = Effective Rs (ohm/sq.) — SPICE Simulation | 98.2 | 142.4 | 268.6 | 100.1 | 147.5 | 286.2 |
| Calculated Resistance (ohm) = Effective Rs (ohm/sq.) — Finite Element Analysis | 96.9 | 138.5 | 254.4 | 99.0 | 144.2 | 274.2 |

The secondary electrical conductor may be any transparent electrical conductor having the specified electrical sheet selected breaks, as listed in Table 8 (below) and shown schematically in FIG. 5B.

TABLE 8

Break Distribution Study #1 - "Low-Rs"

| | Example No. | | | | | |
|---|---|---|---|---|---|---|
| | 33 | 34 | 35 | 36 | 37 | 38 |
| Primary Conductor Trace Width (micrometer) | 1.5 | 1.5 | 1.5 | 1.5 | 1.5 | 1.5 |
| Trace Spacing (micrometer) | 1 | 1 | 1 | 1 | 1 | 1 |
| Pitch - (Cell Size/Node Separation) (micrometers) | 225 | 225 | 225 | 225 | 225 | 225 |
| No. of Complete Segments (+1/2 segment per pitch) | 1 | 2 | 4 | 1 | 2 | 4 |

TABLE 8-continued

Break Distribution Study #1 - "Low-Rs"

| | Example No. | | | | | |
|---|---|---|---|---|---|---|
| | 33 | 34 | 35 | 36 | 37 | 38 |
| Gap Size (micrometers) | 2 | 2 | 2 | 5 | 5 | 5 |
| Complete Segment Length (micrometers) | 148 | 88 | 48 | 145 | 85 | 45 |
| Overlap Length (micrometers) | 73 | 43 | 23 | 70 | 40 | 20 |
| Secondary (Transparent) Conductor Rs (ohm/sq.) | 500 | 500 | 500 | 500 | 500 | 500 |
| Trace Rs (ohm/sq.) | 0.2 | 0.2 | 0.2 | 0.2 | 0.2 | 0.2 |
| Trace Micropattern Open Area Fraction | 97.37% | 97.38% | 97.41% | 97.39% | 97.43% | 97.51% |
| Calculated Resistance (ohm) = Effective Rs (ohm/sq.) SPICE Simulation | 37.4 | 67.6 | 150.8 | 38.5 | 71.3 | 165.1 |
| Calculated Resistance (ohm) = Effective Rs (ohm/sq.) Finite Element Analysis | 36.4 | 63.9 | 136.2 | 37.7 | 68.4 | 152.9 |

The electrical sheet resistance of the primary electrical conductor (0.2 ohm/sq.) is consistent with a physical thickness of approximately 180 nanometers for sputtered silver (at effective bulk electrical resistivity of 3.60 microohm-cm). Other parameters of the electrical conductor designs are given in Table 8 (above), together with calculation results. The secondary electrical conductor may be any transparent electrical conductor having the specified electrical sheet resistance (e.g., ITO, carbon nanotube coating, metal (e.g., Ag) nanowire coating, electrically conducting polymer (e.g., PEDOT-PSS), graphene). The electrical conductors described above may be deposited on a major surface of a PET film (e.g., "ST580"). Furthermore, such a film may take the form of a patterned touch sensor element shown in FIGS. 10-12.

Foreseeable modifications and alterations of this disclosure will be apparent to those skilled in the art without departing from the scope and spirit of this invention. This invention should not be restricted to the embodiments that are set forth in this application for illustrative purposes.

What is claimed is:

1. An article comprising:
   a substrate having a first major surface;
   an electrical conductor pattern on the first major surface of the substrate, the electrical conductor pattern comprising:
   a plurality of separated pairs of separated first and second electrically conductive metallic traces, the first and second electrically conductive metallic traces of each pair of the plurality of pairs having a length of overlap relative to each other of at least 5 times their separation distance, and wherein there are at least 50 of the electrically conductive metallic traces/cm².

2. The article of claim 1, wherein adjacent electrically conductive metallic traces of adjacent pairs within the plurality of pairs have a length of overlap relative to each other of at least 5 times their separation distance.

3. The article of claim 1, wherein the electrical conductor pattern has an open area fraction greater than 80%.

4. The article of claim 1, wherein each electrically conductive metallic trace of a pair is separated from each other by up to 5 micrometers; the electrically conductive metallic traces have widths not greater than 15 micrometers; and the electrically conductive metallic traces have lengths of at least 50 micrometers.

5. The article claim 1, wherein the first and second electrically conductive metallic traces of each pair of the plurality of pairs have a length of overlap relative to each other of at least 10 times their separation distance.

6. The article of claim 1, wherein the substrate is transparent.

7. The article of claim 1, wherein the first and second electrically conductive metallic traces are branched.

8. The article of claim 1, further comprising an electrically conductive layer having first and second generally opposed major surfaces, wherein a major surface of the electrically conductive layer is in contact with at least a portion of the plurality of pairs of first and second electrically conductive metallic traces.

9. The article of claim 8, wherein the electrically conductive layer is transparent and comprises at least one of metal oxide, metal nanowires, electrically conducting polymer, carbon nanotubes, or graphene.

10. The article of claim 9, wherein the electrically conductive layer is patterned and comprises first and second, separated regions.

11. The article of claim 8, wherein the electrically conductive layer is disposed between the substrate and the plurality of pairs of first and second electrically conductive metallic traces.

12. The article of claim 1, wherein the plurality of pairs of first and second electrically conductive metallic traces generally form a pseudo-random two-dimensional network.

13. The article of claim 1, wherein for at least a portion of the pairs of first and second electrically conductive metallic traces the traces are complementarily tapered relative to each other.

14. The article of claim 1, wherein the plurality of pairs of first and second electrically conductive metallic traces generally form a repeating series of lines or a two-dimensional network.

* * * * *

UNITED STATES PATENT AND TRADEMARK OFFICE
CERTIFICATE OF CORRECTION

PATENT NO. : 10,076,026 B2
APPLICATION NO. : 14/437511
DATED : September 11, 2018
INVENTOR(S) : Matthew Frey Page 1 of 1

It is certified that error appears in the above-identified patent and that said Letters Patent is hereby corrected as shown below:

In the Specification

Column 7,
Line 47, after "micrometers)" insert -- . --.

Column 10,
Line 63, delete "2012FLEX" and insert -- 2012 FLEX --, therefor.

Column 11,
Line 26, delete "Article" and insert -- article --, therefor.

Column 13,
Line 43, delete "the of the" and insert -- the --, therefor.

In the Claims

Column 26,
Line 26, in Claim 5, after "article" insert -- of --.

Signed and Sealed this
First Day of January, 2019

Andrei Iancu
*Director of the United States Patent and Trademark Office*